United States Patent
Campos

(10) Patent No.: US 6,278,237 B1
(45) Date of Patent: Aug. 21, 2001

(54) LATERALLY STRUCTURED HIGH RESOLUTION MULTICOLOR ORGANIC ELECTROLUMINESCENCE DISPLAY DEVICE

(75) Inventor: Richard A. Campos, Armonk, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 09/042,019

(22) Filed: Mar. 13, 1998

Related U.S. Application Data

(60) Provisional application No. 60/060,687, filed on Sep. 22, 1997.

(51) Int. Cl.⁷ .................... H01J 1/62; H01J 63/04
(52) U.S. Cl. .................... 313/512; 313/483; 313/504; 313/506
(58) Field of Search .................. 313/501, 502, 313/504, 505, 506, 507, 509, 512, 110, 113–114, 483, 498

(56) References Cited

U.S. PATENT DOCUMENTS

| | | |
|---|---|---|
| 3,710,167 | 1/1973 | Dresner et al. . |
| 5,276,380 | 1/1994 | Tang . |
| 5,294,869 | 3/1994 | Tang et al. . |
| 5,294,870 | 3/1994 | Tang et al. . |
| 5,359,260 | * 10/1994 | Rawlings .................. 313/505 |
| 5,405,710 | 4/1995 | Dodabalapur et al. . |
| 5,424,560 | 6/1995 | Norman et al. . |
| 5,478,568 | 12/1995 | Takayasu et al. . |
| 5,530,269 | 6/1996 | Tang . |
| 5,532,550 | 7/1996 | Adler . |
| 5,550,066 | 8/1996 | Tang et al. . |
| 5,554,911 | 9/1996 | Nakayama et al. . |
| 5,587,589 | 12/1996 | So et al. . |
| 5,598,058 | 1/1997 | LaPointe . |
| 5,608,287 | 3/1997 | Hung et al. . |
| 5,616,416 | 4/1997 | Yamaguchi . |
| 5,641,611 | 6/1997 | Shieh et al. . |
| 5,650,640 | 7/1997 | Stafford et al. . |
| 5,831,384 | * 11/1998 | Potter ....................... 313/512 |

* cited by examiner

*Primary Examiner*—Vip Patel
*Assistant Examiner*—Mack Haynes
(74) *Attorney, Agent, or Firm*—David R. Yohannan; Collier Shannon Scott, PLLC

(57) ABSTRACT

An organic light emitting device for a multicolor image display. The elements of the device are arranged laterally along the substrate surface in a pillar and channel arrangement, rather than the traditional method of vertical stacking. The invention's pillar and channel architecture provides a rugged structure which can be efficiently encapsulated. The lateral arrangement of the various elements along the substrate reduces sheet resistance and increases external efficiency by allowing the typical transparent conductor layer to be replaced with a conventional metal.

23 Claims, 5 Drawing Sheets

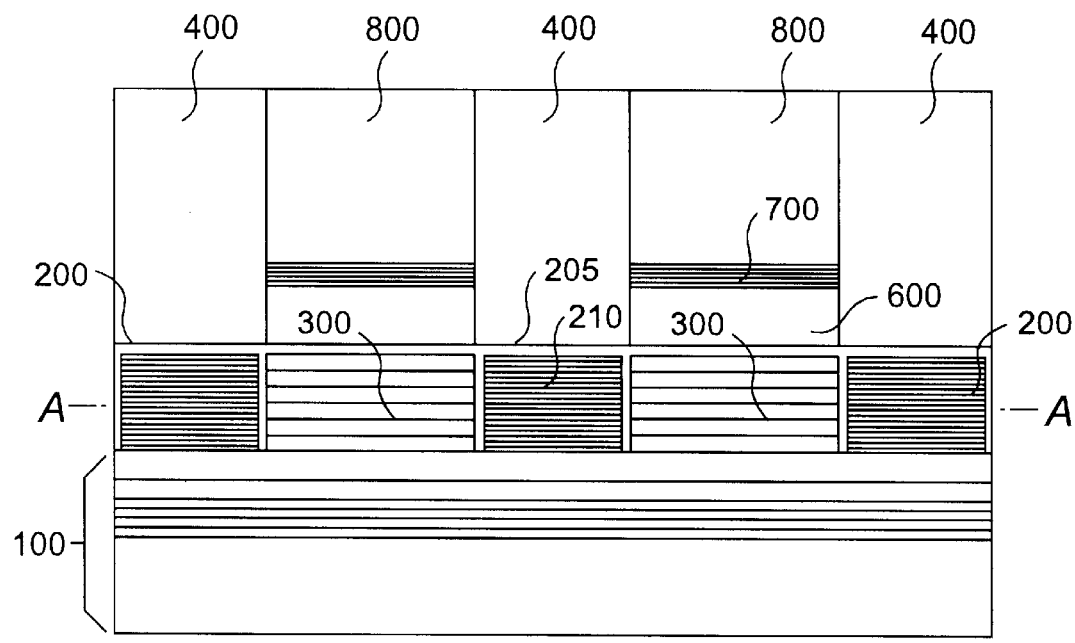
FIG. 5
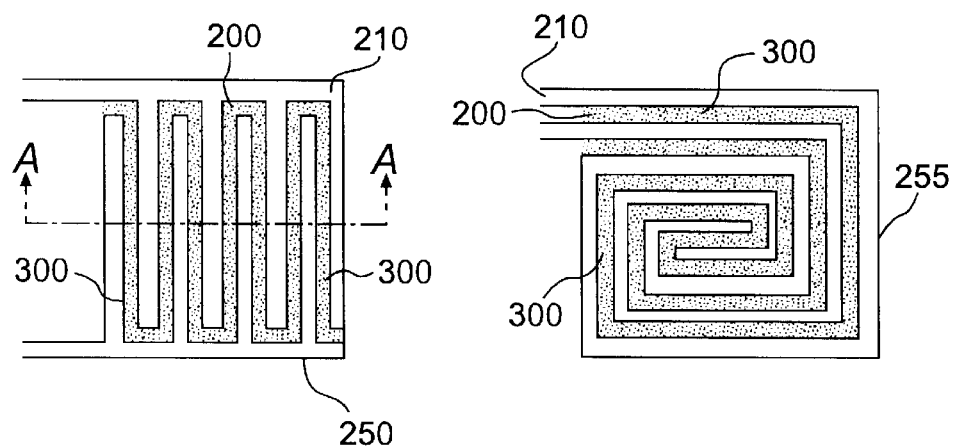
FIG. 6  FIG. 7

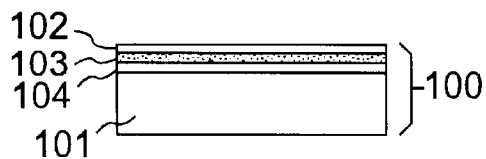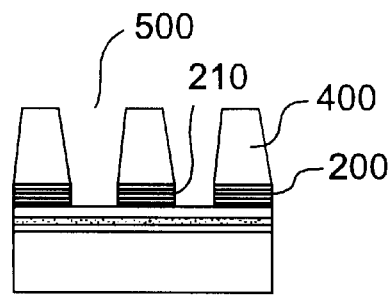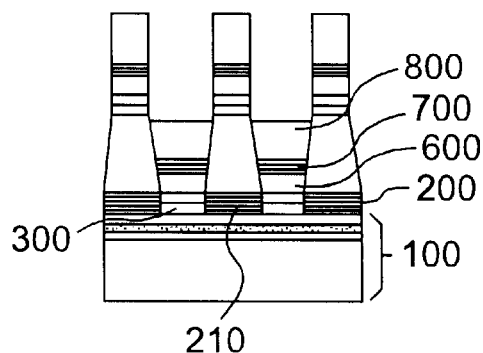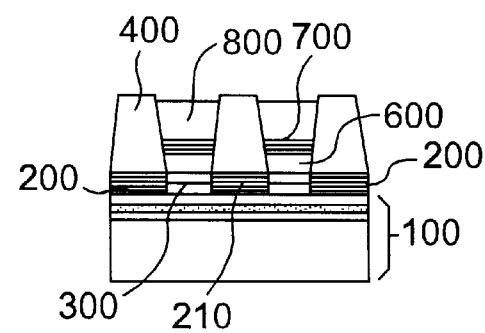
FIG. 8  FIG. 9
FIG. 10  FIG. 11

LATERALLY STRUCTURED HIGH RESOLUTION MULTICOLOR ORGANIC ELECTROLUMINESCENCE DISPLAY DEVICE

CROSS REFERENCE TO RELATED APPLICATIONS

This application claims priority to U.S. Provisional Application Ser. No. 60/060,687 entitled "LATERALLY STRUCTURED, HIGH RESOLUTION MULTICOLOR ORGANIC ELECTROLUMINESCENCE DISPLAY DEVICE," filed on Sep. 22, 1997.

FIELD OF THE INVENTION

The present invention is directed to an organic light emitting device ("OLED"). In particular, the device of the present invention is an innovative advancement over previous OLED designs due to its arrangement transversely along the substrate surface, rather than vertically stacked upon it. Additionally, the design of the present invention yields improved operating characteristics and is easier to fabricate.

BACKGROUND OF THE INVENTION

A typical OLED generates multicolor, intense light emission from vertical stacks of organic thin films sandwiched between charge injecting conductors. The OLED's organic materials are typically arranged in single or multilayer stacks. The conductors supply, upon the application of voltages with sufficient amplitude and polarity, both negative and positive charge carriers which recombine in the organic stack to release pure energy in the form of light. This phenomenon is called electroluminescence. In a vertically stacked OLED, at least one of the conductors must be optically transparent in order to couple light in the viewer's direction.

Typically, conductor materials for vertically stacked OLEDs are indium-tin-oxide (ITO) for the hole-injecting transparent conductor, and co-evaporated magnesium and silver (Mg:Ag) for the electron-injecting conductor. ITO is a problematic material for a number of reasons. First, ITO is normally deposited in a high-temperature sputtering process which can damage the organic material. Second, the deposition process for an ITO conductor is variable and can yield an unacceptably rough microstructure. Third, it is difficult to control the etching of the ITO layer in sub-micron dimensions using traditional wet etching techniques. Finally, the surface condition of ITO is unfavorable for injection and, as a result, oxidation is required to achieve high performance. Furthermore, in the traditional vertically stacked OLED architecture (e.g., ITO on one side with Mg:Ag on the opposite side of the organic material) the moisture-sensitive magnesium conductor has similar problems with patterning and environmental exposure.

In vertical OLEDs, the organic material is sequentially deposited in layers of molecular film. This sequential process is more time consuming and less efficient than the deposition of one layer of organic material comprised of a polymeric blend of the required material constituents. The fabrication process for the vertically stacked OLED also typically includes the need for mask changes during the sequential deposition of materials. The mask changes add further complexity and cost to the manufacturing process.

Vertically stacked prior art OLEDs, which employ a continuous (unpatterned) stack of organic materials, face the additional problem of unavoidable increases in lateral charge leakage. This charge leakage phenomenon typically occurs when one display device contains numerous OLEDs or pixel elements mounted on a substrate. The lateral charge conduction or leakage occurs along the substrate direction as the individual OLEDs decrease in size to submicron dimensions. These lateral leakage currents destroy the integrity of the overall display by creating crosstalk between the individual OLEDs or pixel elements.

Light piping is another problem associated with vertically stacked OLEDs. Light piping, a phenomenon also referred to as total internal reflection, results when light passes from a high dielectric constant material to a low dielectric constant material over a set of incidence angles determined by the laws of geometric optics and the frequency response of the materials. Light is confined to the high dielectric constant material. Light piping forms the basis for all fiber optic communications technologies. Light piping in the glass substrate creates optical losses. Both light piping and current leakage reduce the overall external efficiency of the display device. Accordingly, there is a need for microcavity structure within the OLED to provide output enhancement.

The typical applications of OLEDs include, for example, flat panel displays, optical interconnects, optical fiber communications and LED printing. Given the nature of these fields, the need exists for an OLED which is reliable and capable of withstanding forces associated with its use. The vertically stacked OLED does not provide any inherent structural stability. The horizontal layers are merely stacked upon one another without any means for resisting lateral or forces. Accordingly, there is a need for an OLED structure which provides increased support and stability for the organic layers.

The present invention addresses the above problems, in whole or in part, via a display device, which utilizes transversely stacked OLEDs. Each OLED of the present invention typically serves as one color component of a color pixel. The present invention also addresses the problems associated with patterning a multicolor display device due to the degradation or destruction of organic light-emitting materials through exposure to moisture, oxygen, light, temperature and chemicals. This exposure unavoidably results from traditional semiconductor fabrication methods. The present invention solves the aforementioned problems with traditional OLEDs, and provides other benefits as well.

OBJECT OF THE INVENTION

It is therefore an object of the present invention to reduce sheet resistance and increase device efficiency by replacing the transparent conductor material with a conventional metal.

It is another object of the present invention to increase device efficiency through reduction of optical piping losses.

It is a further object of the present invention to provide chromaticity enhancement through the formation of a microcavity structure.

It is still another object of the present invention to provide an OLED with a rugged architecture with enhanced structural stability.

It is a further object of the present invention to provide encapsulation protection of organic light emitting materials through the use of a buried channel architecture.

It is still another object of the present invention to accommodate either polymeric or molecular film approaches to organic electroluminescence.

It is yet another object of the present invention to facilitate sequential color patterning of adjacent pixels through the use of buried channel architecture.

Additional objects and advantages of the invention are set forth, in part, in the description which follows, and, in part, will be apparent to one of ordinary skill in the art from the description and/or from the practice of the invention.

SUMMARY OF THE INVENTION

In response to the foregoing challenges and to achieve the objects set forth above and other objects that will become apparent in the following description, an innovative organic light emitting device is provided. The organic light emitting device may comprise: a substrate, wherein the substrate is comprised of a substantially planar base, a microcavity stack overlying the base, a layer of conducting film overlying the microcavity stack, and a thin insulator layer overlying the layer of conducting film; plural electrode stacks overlying the insulator layer wherein the electrode stacks comprise a bottom layer of conductive material and a top layer of non-conductive material; a light emitting stack disposed between the electrode stacks, wherein the light emitting stack comprises a layer of light emitting organic material overlying the insulator layer and contacting the bottom layer of conductive material; a layer of filler material overlying the layer of organic material; a mirror overlying the filler layer; and an encapsulation layer overlying the mirror. The layer of light emitting organic material may be comprised of a multilayer stack of organic material, and the base may be either transparent or opaque.

Another embodiment of the organic light emitting device of the present invention may comprise: a substantially planar substrate; a plurality of conductors laterally spaced on the planar substrate, the conductors having sidewalls; and a layer of light emitting organic material overlying the planar substrate and contacting a sidewall of each of two of the plurality of conductors. The planar substrate may comprise a layer of insulator overlying a layer of glass. The planar substrate may further comprise a layer of dielectric material located between the insulated material and the layer of glass. The planar substrate may further comprise a layer of conducting film located between the insulator and the layer of glass. The device may further comprise a layer of nonconducting material overlying each of the plurality of conductors. The layer of light emitting organic material may be comprised of a multi-layer stack of organic material and may be covered by a layer of filler material. Each of the plurality of conductors may be composed of a metallic material. The plurality of conductors may overlie the substrate in an interdigitation pattern.

A further embodiment of the organic light emitting device of the present invention may comprise: a substantially planar substrate; a plurality of conductors laterally spaced on the planar substrate; a layer of light emitting organic material overlying the planar substrate between two of the plurality of conductors; a layer of nonconducting material overlying each of the plurality of conductors; and a layer of filler material overlying the layer of light emitting organic material. The device may further comprise a mirror overlying the filler layer. The layer of light emitting organic material may be comprised of a multilayer stack of organic material. Each of the plurality of conductors may be comprised of a metallic material. The planar substrate may be comprised of a layer of insulator overlying a layer of glass. The planar substrate may further comprises a layer of dielectric material located between the insulator and the layer of glass. The planar substrate may further comprise a layer of conducting film located between the insulator and the layer of glass. The plurality of conductors may overlie the planar substrate in an interdigitation pattern, which may be a spiral pattern.

The present invention further includes an innovative method of fabricating an organic light emitting device comprising the steps of: providing a substantially planar substrate; providing a plurality of laterally spaced conductors on the planar substrate; forming a layer of light emitting organic material between two of the plurality of conductors. The step of forming a layer of light emitting organic material may be comprised of depositing multiple layers of organic material sequentially. The step of providing a plurality of conductors may be comprised of arranging the conductors on the planar substrate in an interdigitation pattern. The method of the present invention may further comprise the step of depositing a layer of filler material overlying the layer of light emitting organic material. The method may also include the step of depositing a mirror layer on top of the layer of filler material. The method may further comprise the step of covering each of the plurality of conductors with a layer of nonconducting material. The method may include the step of encapsulating the device following the deposition of the organic material, and applying photoresist to the device following the encapsulation step. Following the encapsulating step the method may include the step of removing accumulated materials from the nonconducting pillars.

The present invention further may include an organic light emitting device wherein each light emitting diode comprises two interdigitated patterns of conductive material in contact with an intermediate pattern of light emitting organic material. The interdigitated patterns may comprise spirals.

It is to be understood that both the foregoing general description and the following detailed description are exemplary and explanatory only, and are not restrictive of the invention as claimed. The accompanying drawings, which are incorporated herein by reference and which constitute a part of this specification, illustrate certain embodiments of the invention, and together with the detailed description serve to explain the principles of the present invention.

BRIEF DESCRIPTION OF THE DRAWINGS

The invention will be described in conjunction with the following drawings in which like reference numerals designate like elements and wherein:

FIG. 5 is a partial cross sectional view of one color component of a color pixel, along the line A—A in FIG. 6;

FIG. 6 is a top view of an interdigitated pixel element;

FIG. 7 is a top view of an alternative design of an interdigitated pixel element;

FIGS. 8 through 11 illustrate a method of fabricating a color OLED display; and

DETAILED DESCRIPTION OF THE INVENTION

Figure 1:
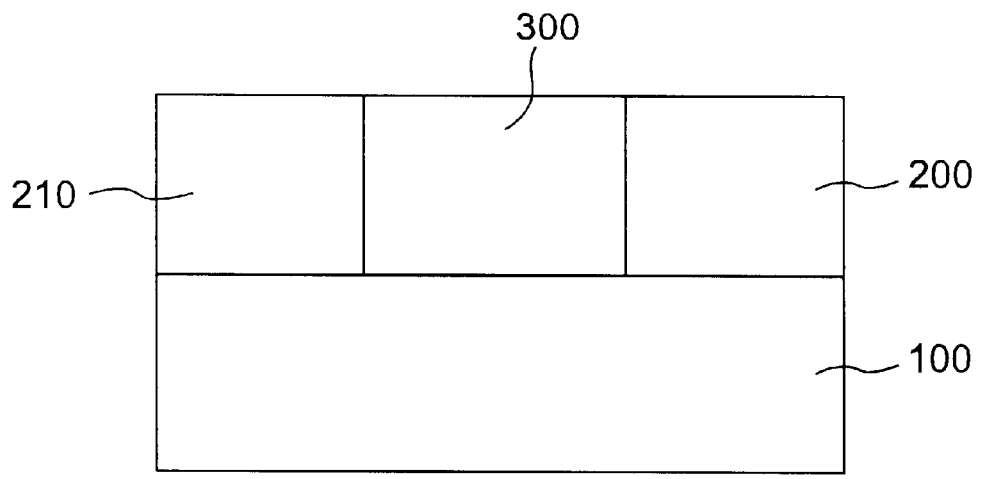
FIG. 1 is a cross sectional view of a laterally structured light emitting device according to the present invention.

Referring to FIG. 1, there is shown an organic light emitting device with transversely spaced conductors. FIG. 1 is a cross sectional view of a light emitting device in which conductors 200 and 210 overlay the substrate 100. Light emitting organic material 300 is sandwiched between the conductors 200 and 210. When a voltage is applied to the conductors 200 and 210, holes and electrons may move from the conductors into the organic material 300. When the holes and electrons combine in the organic material 300 light may be produced. The substrate 100 may be formed from a material which allows the emitted light to pass through to a viewer, such as glass. Organics 300 are transparent to the light they emit, allowing for the possibility of a two-way viewable display. If substrate 100 is opaque (e.g., a silicon wafer) the device is solely up-emitting. If substrate 100 is transparent and a mirror element 700 (see description of FIG. 5) is included, the device is solely down emitting.

The present invention's innovative arrangement of the conductors 200 and 210 transversely along the coated substrate 100, rather than in a vertical stack as in a conventional OLED, allows a wide variety of metals to be considered as conductor material. Transparent conducting material (e.g., Indium Tin Oxide (ITO)) is not required. The conductors 200 and 210 are preferably formed from metals such as Cu, Mo, Ni, Al, Cr, or Au. These materials are preferred because they are usually easier to process. The metal conductors also manifest reduced energy band offsets relative to the neighboring organic material 300. As a result of the present invention's use of standard metallic conductors 200, 210 the fabrication problems associated with ITO, Mg and Ca conductors are avoided. Hi-resolution lithography (e.g., x-ray, electron beam) may be used to pattern the conductors 200 and 210.

It is also within the scope of the present invention that the conductors are comprised of metallic alloys. Alloys may provide better injection characteristics and/or increased stability. The present invention also includes the use of doped silicon injectors as conductors. These conductors may be integrated onto silicon wafers using standard semiconductor technology as described in "SILICON COMPATIBLE ORGANIC LIGHT EMITTING DIODE," Kim et. al., *Journal of Lightwave Technology*, Vol. 12, No. Dec. 12, 1994, which is hereby incorporated by reference.

Figure 2:
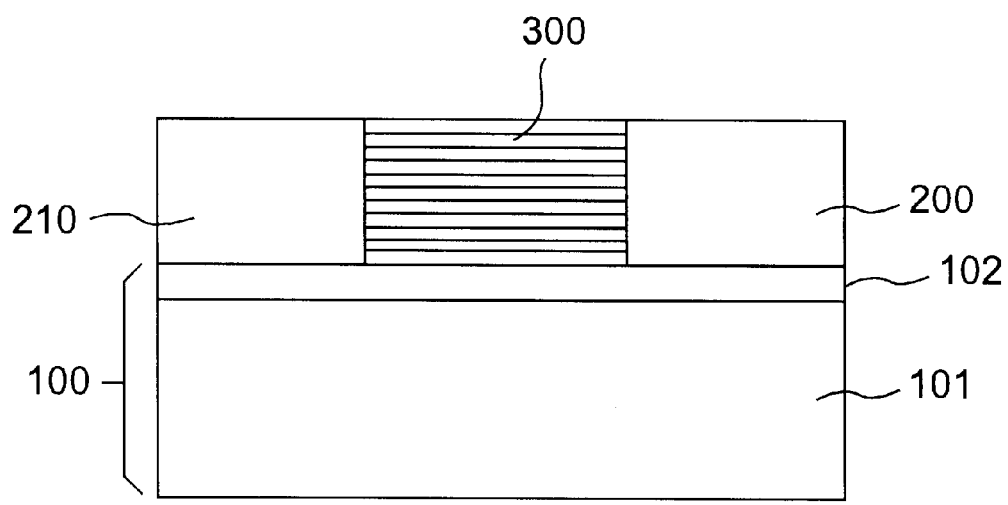
FIG. 2 is a cross sectional view of an alternative embodiment device according to the present invention.

Light emitting organic material 300 may be located between the conductors 200 and 210. The organic material 300 can be either a single organic layer or a stack of organic layers, as shown in FIG. 2. When deposited in a stack each organic layer may accomplish a different function such as hole transport, electron transport or light emission. When a single organic layer is used, that layer may be a blend of organic materials capable of performing the required transport and emission functions. The organic layer 300 may be constructed using either a polymer approach or a molecular film approach. The preferred method uses the molecular film approach to deposit hole transport, emission and/or electron transport layers of organic material sequentially in a repeating pattern until the vertical height of the organic layers 300 reaches the top of the metal conductors 200 and 210. The height of the conductors 200 and 210 should be greater than or equal to the organic stack height. Typically, the conductors would be between 1200 to 2500 Å in height.

The device disclosed in FIG. 2 further includes an additional layer within the substrate 100. The substrate 100 comprises a substantially planar base of transparent glass or silicon 101 and a layer of thin insulator material 102. The base 101 is substantially planar and generally smooth to allow for application of uniform layers above. The insulator layer 102 electrically isolates the conductors 200 and 210 from each other, and from the base 101. The insulator layer 102 may be transparent to allow emitted light to pass through. The insulator layer 102 preferably is comprised of $SiO_2$ with a thickness of approximately 3000 Å.

Figure 3:
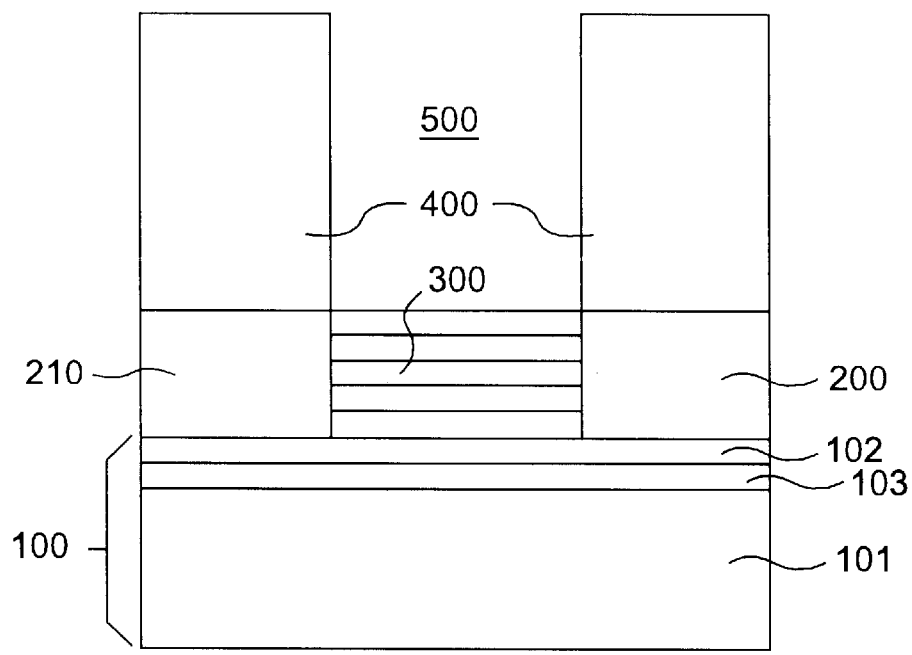
FIG. 3 is a cross sectional view of another embodiment of a device according to the present invention.

The substrate may further include a layer of conducting film 103, as shown in FIG. 3. The conducting film 103 may be either transparent or opaque. ITO, or other structures from the indium, zinc oxide families (e.g. $In_2O_3$:x, ZnO:x with x=Ga, Al or Sn) may be used to form a transparent film, and Al, Cu, Ni, etc. may be used to form an opaque film. The conducting film 103 has a thickness generally less than 1500 Å. One purpose of the transparent conducting film 103 is to couple the emitted light to the viewer through a transparent substrate. The conducting film 103 also may charge the thin insulator layer 102 when a suitable low voltage (e.g., less than 25V) is applied. The insulator layer 102, when charged, is capable of manipulating the presence of charge carriers at the interfaces between the organic material layers 300. The charged insulator layer 102 may further enhance the likelihood that laterally moving charge carriers will recombine to produce electroluminescence at the organic interfaces between the layers of organic material. When a single blended organic layer is used instead of a multilayer stack, the insulating layer 102 may not be required to promote charge carrier recombination.

The device in FIG. 3 further comprises nonconducting pillars 400 positioned on top of the conductors 200 and 210. The pillars 400 are at least equal in height to the conductors 200 and 210 on which they reside. The pillars 400 are composed of inorganic materials such as oxides (e.g. SiO, $SiO_2$) and may be deposited using standard semiconductor fabrication methods (e.g., thermal, sputter, CVD, etc.). The pillars 400 partition the light emitting device, creating vertical channels 500 in the interpillar space. The organic material 300 is buried at the bottom of the vertical channels 500.

The pillar design of the present invention provides certain advantages. The nonconducting pillars 400 cover the top surface of the metal conductors 200 and 210 partitioning the matrix and protecting the conductors. When used in combination with the filler layer 600, the pillars 400 also may prevent the permeation of moisture into the vertical channels 500 where light emission takes place. The pillars 400 also provide stability and rigidity to the organic layers 300, making the device less susceptible to damage. The walls of the pillars 400 also serve to induce light piping in the interpillar spaces or vertical channels 500.

Figure 4:
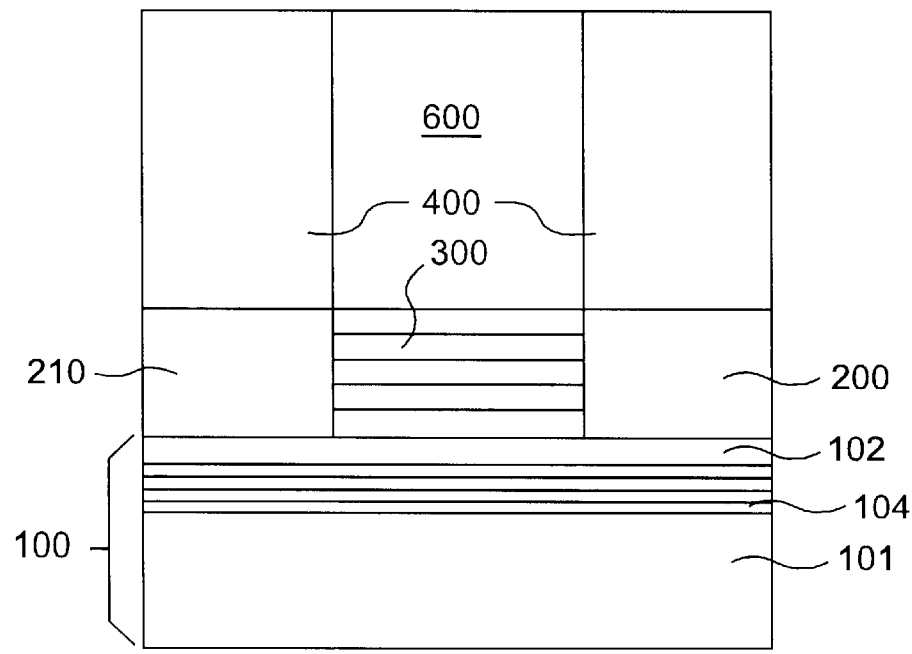
FIG. 4 is a cross sectional view of another embodiment of a device according to the present invention.

Light piping may be encouraged by depositing a filler layer 600 with a suitably larger dielectric material constant on top of the organic material 300, as shown in FIG. 4. Preferably, the filler layer 600 is formed from high index of refraction a materials such as barium titanate ($BaTiO_3$) or silicon nitride ($Si_3N_4$).

The device in FIG. 4 has a substrate layer 100 comprised of a substantially planar base 101, an insulator layer 102, and multiple layers of dielectric material which comprise a microcavity stack 104. The microcavity stack 104 resides directly over the transparent glass layer 101 and may serve as a reflection enhancing coating. The microcavity stack 104 typically consists of multilayer stacks of $SiO_2/TiO_2$, where each layer has a thickness typically less than 1000 Å. The multiple layers of dielectric have alternating indices of refraction, creating a quarter wave mirror effect. The light emitting device of the present invention may include either the conducting film 103 or the microcavity stack 104, or both. When used in combination with the conducting film 103, the microcavity stack 104 is positioned above the glass layer 101, but below the transparent conducting film 103.

Figure 12:
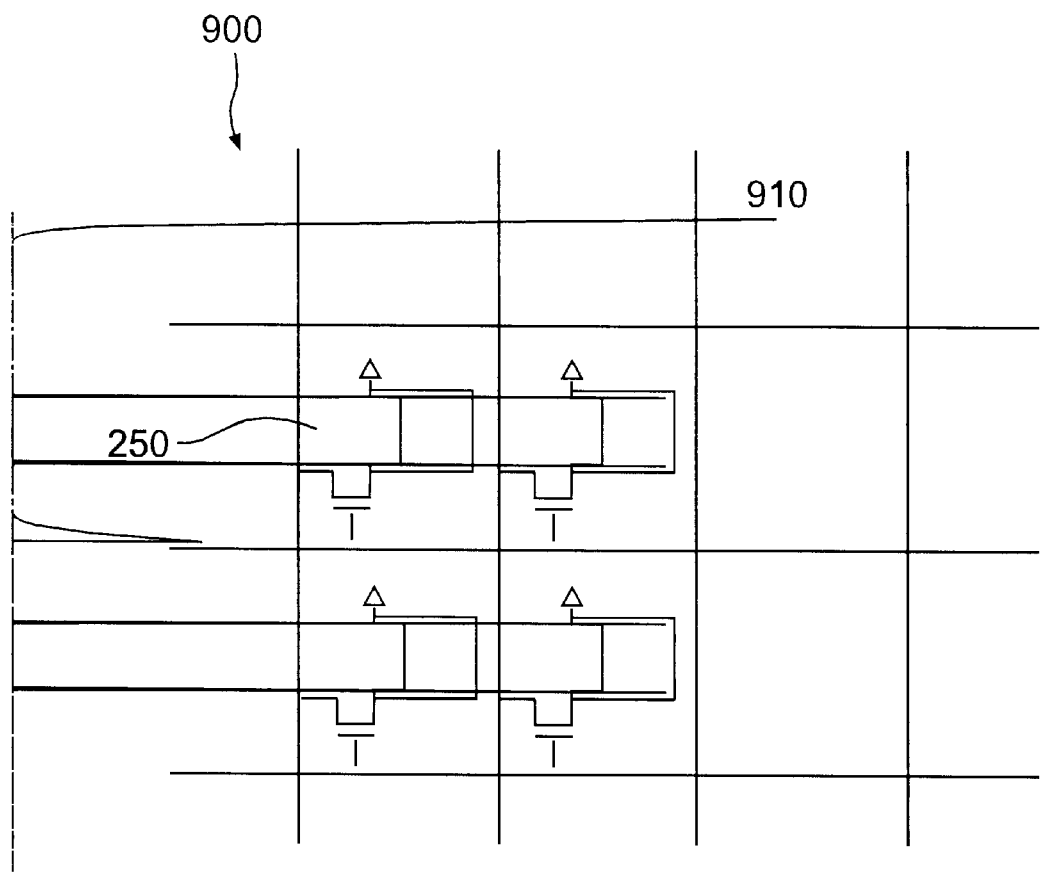
FIG. 12 illustrates a single-transistor active matrix layout.

A typical color pixel 910 has four color components 250 (e.g. Red, Green, Green, Blue or RGGB). The display colors are generated through the illumination of a combination of the color components. The single transistor active matrix layout 900, shown in FIG. 12, is indicative of the color pixel 910 with its four color components 250. A top view of the color component 250, is shown in FIG. 6. The preferred embodiment of present invention with its associated elements is shown in FIG. 5, which represents a partial cross-sectional view of one color component 250, of a color pixel 910.

In addition to those materials previously described, the device shown in FIG. 5 may further comprise a thin film 205 deposited on top of each of the conductors 200 and 210. The thin film 205 is preferably composed of oxides or fluorides such as MgO, $SiO_2$, $BaTiO_3$, or LiF and $MgF_2$. The thin film 205 which overlies conductor 210 may be comprised of a different material than the film overlying conductor 200. The film 205 generally has a thickness no greater than 100 Å. However, thicker films are considered to be within the scope of the invention. The thin film 205 provides further reductions in band offset complementing the underlying metal conductors.

The thin film 205 imposes an additional voltage drop across the interface between the conductors 200 and 210 and the organic material 300. This helps to decrease the band offset of these elements, or, stated differently, it promotes alignment of the electronic energy levels in these elements, and therefore assists in charge injection of the interface. The thin element 205 can serve to improve the adhesion of the pillar 400 to the conductors 200 and 210 in addition to assisting injection of charge from said conductors into the organic 300. The use of the thin film is further described in the Kim article cited above. In addition to reducing band offset, the thin film 205 protects the conductors 200 and 210 from moisture and reduces exciton quenching at the conductors' metal atoms.

The external efficiency of the device in FIG. 5 is further improved by depositing a thin metal layer 700 in the vertical channel 500 on top of the filler layer 600. The primary purpose of the metal layer 700 is to create a mirror surface for use with a transparent substrate that reflects the emitted light toward the substrate 100 and the viewer. When the mirror surface of the thin metal layer 700 is combined with the pillars 400 and the filler layer 600, a microcavity is formed. The microcavity serves to increase light yield in the view direction, through the transparent insulator 102 and the glass substrate 101. The microcavity traps light between two reflective surfaces, and places restrictions on the frequencies of light which can exit the structure. As a result, the microcavity may also be used to spectrally shape the output light for chromaticity enhancement. The metal layer 700 further provides a barrier to moisture penetration in the interpillar region.

Despite all of its advantages, the metal layer is an optional component of the invention. In fact, the omission of the metal mirror layer 700 may result in a two-way viewable display. An encapsulation layer 800 fills the interpillar space 500 and buries the entire structure shown in FIG. 5. For top-emitting or two-way viewable display, the encapsulation layer 800 may be a transparent oxide such as $SiO_2$ or SiO. In this embodiment, the organic layer 300 is well protected at the bottom of the vertical channel 500 beneath a filler layer 600, a mirror 700 and the encapsulation layer 800.

The top view of a pixel component 250 is shown in FIG. 6. The conductors or leads 200 and 210 of the color component 250 are spaced apart in alternating fashion in a layout known as interdigitation. An alternative interdigitation design 255 is shown in FIG. 7. Each pixel color component is approximately 3 μm by 3 μm. Therefore, a full color pixel (RGGB) 501 will occupy at least a 12 μm by 12 μm area, plus the additional space for the active matrix elements shown in FIG. 12. The present invention includes many possible patterns for interdigitation. A comb design is shown in FIG. 6, while FIG. 7 discloses a spiral design. FIGS. 6 and 7 are merely two examples of microstructured patterns which cannot be resolved by the viewer. Any pattern which the viewer cannot resolve is an acceptable alternative, and within the scope of the present invention. FIG. 12 illustrates a single-transistor active matrix 900 layout comprising at least one full color pixel 910 containing RGGB components 250.

The spacing between the conductors 200 and 210 should be small (e.g., less than 0.2 μm) in order to permit charge carrier conduction upon the application of the required voltages. Current technology in the area of microlithography fabrication is capable of supporting construction of a device with the required clearances. The conductors 200 and 210 are either electron or hole injectors, which due to the interdigitation scheme alternate positionally.

The invention includes an innovative method of fabricating an organic light emitting device. The device is shown at different stages of the process in FIGS. 8–11. First, as shown in FIG. 8, the substrate 100 is formed. The insulator layer 102 is deposited on the coated substrate comprising a glass layer 101, a multilayer dielectric 103, and a layer of conducting film 104. Second, the conductors 200, 210, are placed on the substrate 100. The non-conducting pillars 400 are stacked on the conductors 200, 210. FIG. 9 discloses the component structure following the inclusion of the conductors 200, 210 and the non-conducting pillars 400. Next, the organic material 300, filler layer 600, mirror 700 are deposited in the vertical channels 500. The device is encapsulated and the device shown in FIG. 10 results. During fabrication of the various layers of interpillar materials, material accumulates on top of the pillars 400 (see FIG. 10). The material accumulation on top of the pillar 400 occurs as a result of the deposition of materials in the channel 500. A standard solvent wash which does not affect the integrity of the encapsulation layer 800 may be used to remove the materials which accumulate atop the vertical pillars 400. Compositions comprising acetone, isopropyl alcohol (IPA), N-methyl pyrolidone (NMP) may be used. Following the lift-off wash and the removal of accumulated materials on top of the pillars 400, the device appears as shown in FIG. 11.

After encapsulation and washing, photoresist is spun over the pixel color component 250. Photoresist completes the fabrication and protects the component 250 from any damage or contamination. Since each pixel component is protected following fabrication, materials may be deposited in adjacent areas of the matrix 900 during the fabrication of subsequent components without adversely affecting a pixel component 250 already completed. Conventional (i-line) photolithography is used to define elements 250 for processing of color materials. The process of the present invention provides efficient sequential color display fabrication.

Following the application of photoresist, the procedure may be repeated to make additional color pixel components. The buried channel architecture of the present invention facilitates sequential color patterning of adjacent pixels. Subsequent fabrication of adjacent pixels will not disturb the pixel components already in place, since the vital organic materials 300 are buried and protected in the vertical channel 500.

It will be apparent to those skilled in the art that various modifications and variations may be made in the preparation and configuration of the present invention without departing from the scope and spirit of the present invention. Thus, it is intended that the present invention covers the modifications and variations of the invention, provided they come within the scope of the appended claims and their equivalents.

I claim:

1. An organic light emitting device comprising:
   a substrate, wherein said substrate is comprised of a substantially planar base, a microcavity stack overlying said base, a layer of conducting film overlying said microcavity stack, and a thin insulator layer overlying said layer of conducting film;
   plural electrode stacks overlying said insulator layer wherein said electrode stacks comprise a bottom layer of conductive material and a top layer of non-conductive material;
   a light emitting stack disposed between said electrode stacks, wherein said light emitting stack comprises a layer of light emitting organic material overlying said insulator layer and contacting said bottom layer of conductive material;
   a layer of filler material overlying said layer of organic material;
   a mirror overlying said filler layer; and
   an encapsulation layer overlying said mirror.

2. The device of according to claim 1, wherein said layer of light emitting organic material is comprised of a multi-layer stack of organic material.

3. The device of according to claim 1, wherein said base is transparent.

4. The device of according to claim 1, wherein said base is opaque.

5. An organic light emitting device comprising:
   a substantially planar substrate:
   a pair of conductors laterally spaced on said planar substrate, said conductors having sidewalls;
   a layer of light emitting organic material overlying said planar substrate and contacting a sidewall of each of said pair of conductors, wherein said pair of laterally spaced conductors are adapted to provide a voltage laterally across said layer of light emitting organic material;
   wherein said planar substrate comprises a layer of insulator overlying a layer of glass; and
   wherein said planar substrate further comprises a layer of dielectric material located between said insulator and said layer of glass.

6. An organic light emitting device comprising:
   a substantially planar substrate;
   a pair of conductors laterally spaced on said planar substrate, said conductors having sidewalls;
   a layer of light emitting organic material overlying said planar substrate and contacting a sidewall of each of said pair of conductors, wherein said pair of laterally spaced conductors are adapted to provide a voltage laterally across said layer of light emitting organic material;
   wherein said planar substrate comprises a layer of insulator overlying a layer of glass; and
   wherein said planar substrate further comprises a layer of conducting film located between said insulator and said layer of glass.

7. An organic light emitting device comprising:
   a substantially planar substrate;
   a pair of conductors laterally spaced on said planar substrate, said conductors having sidewalls;
   a layer of light emitting organic material overlying said planar substrate and contacting a sidewall of each of said pair of conductors, wherein said pair of laterally spaced conductors are adapted to provide a voltage laterally across said layer of light emitting organic material; and
   wherein said layer of light emitting organic material is covered by a layer of filler material.

8. An organic light emitting device comprising:
   a substantially planar substrate;
   a pair of conductors laterally spaced on said planar substrate said conductors having sidewalls;
   a layer of light emitting organic material overlying said planar substrate and contacting a sidewall of each of said pair of conductors, wherein said pair of laterally spaced conductors are adapted to provide a voltage laterally across said layer of light emitting organic material; and
   wherein said pair of conductors overlie said substrate in an interdigitation pattern.

9. An organic light emitting device comprising:
   a substantially planar substrate;
   a pair of conductors laterally spaced on said planar substrate;
   a layer of light emitting organic material overlying said planar substrate between said pair of conductors;
   a layer of nonconducting material overlying each of said pair of conductors; and
   a layer of filler material overlying said layer of light emitting organic material, wherein said pair of laterally spaced conductors are adapted to provide a voltage laterally across said layer of light emitting organic material.

10. The device according to claim 9, further comprising a mirror wherein said mirror overlies said filler layer.

11. The device according to claim 9, wherein said layer of light emitting organic material is comprised of a multilayer stack of organic material.

12. The device according to claim 9, wherein each of said pair of conductors is comprised of a metallic material.

13. The device according to claim 9, wherein said planar substrate is comprised of a layer of insulated material overlying a layer of glass.

14. The device according to claim 13, wherein said planar substrate further comprises a layer of dielectric material located between said insulator and said layer of glass.

15. The device according to claim 13, wherein said planar substrate further comprises a layer of conducting film located between said insulator material and said layer of glass.

16. The device according to claim 9, wherein said pair of conductors overlie said planar substrate in an interdigitation pattern.

17. The device according to claim 9, wherein said pair of conductors overlie said planar substrate in a spiral pattern.

18. A method of fabricating an organic light emitting device comprising the steps of:
   providing a substantially planar substrate;
   providing a pair of laterally spaced conductors on the planar substrate; and forming a layer of light emitting organic material between the pair of conductors, wherein said pair of laterally spaced conductors are adapted to provide a voltage laterally across said layer of light emitting organic material; and wherein said step of providing a pair of conductors comprises arranging the conductors on the planar substrate in an interdigitation pattern.

19. A method of fabricating an organic light emitting device comprising the steps of:

providing a substantially planar substrate;

providing a pair of laterally spaced conductors on the planar substrate; and forming a layer of light emitting organic material between the pair of conductors, wherein said pair of laterally spaced conductors are adapted to provide a voltage laterally across said layer of light emitting organic material; and further comprising the step of depositing a layer of filler material overlying the layer of light emitting organic material.

20. The method according to claim 19, further comprising the step of depositing a mirror layer on top of the layer of filler material.

21. A method of fabricating an organic light emitting device comprising the steps of:

providing a substantially planar substrate;

providing a pair of laterally spaced conductors on the planar substrate; and forming a layer of light emitting organic material between the pair of conductors, wherein said pair of laterally spaced conductors are adapted to provide a voltage laterally across said layer of light emitting organic material;

further comprising the step of encapsulating the device following the deposition of the organic material; and further comprising the step of applying photoresist to the device following said encapsulation step.

22. An organic light emitting device wherein each light emitting diode comprises two interdigitated patterns of conductive material in contact with an intermediate pattern of light emitting organic material.

23. The device according to claim 22, wherein said interdigitated patterns comprise spirals.

\* \* \* \* \*